(12) United States Patent
Cichocki et al.

(10) Patent No.: US 12,315,573 B2
(45) Date of Patent: May 27, 2025

(54) METHOD AND APPARATUS TO REDUCE POWER CONSUMPTION OF PAGE BUFFER CIRCUITRY IN A NON-VOLATILE MEMORY DEVICE

(71) Applicant: Intel NDTM US LLC, Santa Clara, CA (US)

(72) Inventors: Mattia Cichocki, Rome (IT); Violante Moschiano, Avezzano (IT); Tommaso Vali, Sezze (IT); Guido Luciano Rizzo, Albignasego (IT); Chang Wan Ha, San Ramon, CA (US); Richard Fastow, Cupertino, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 0 days.

(21) Appl. No.: 18/127,217

(22) Filed: Mar. 28, 2023

(65) Prior Publication Data

US 2023/0230639 A1    Jul. 20, 2023

(51) Int. Cl.
*G11C 16/24* (2006.01)
*G11C 16/04* (2006.01)
*G11C 16/26* (2006.01)
*G11C 16/30* (2006.01)

(52) U.S. Cl.
CPC .......... *G11C 16/24* (2013.01); *G11C 16/0483* (2013.01); *G11C 16/26* (2013.01); *G11C 16/30* (2013.01)

(58) Field of Classification Search
CPC ..... G11C 16/24; G11C 16/0483; G11C 16/26; G11C 16/30; G11C 11/5628; G11C 11/5642; G11C 16/08; G11C 16/10

USPC ........................................ 365/185.17, 185.24
See application file for complete search history.

(56) References Cited

U.S. PATENT DOCUMENTS

| | | | |
|---|---|---|---|
| 7,684,256 B2 * | 3/2010 | Kim | G11C 16/3427 365/185.11 |
| RE48,930 E * | 2/2022 | Nam | G11C 16/16 |
| 11,276,470 B2 | 3/2022 | Moschiano et al. | |
| 2006/0114719 A1 * | 6/2006 | Lee | G11C 16/04 365/185.17 |
| 2011/0157974 A1 * | 6/2011 | Lee | G11C 16/0433 365/185.18 |
| 2012/0163093 A1 * | 6/2012 | Aritome | G11C 11/5628 365/185.22 |
| 2012/0281470 A1 * | 11/2012 | Fukuda | G11C 16/06 365/185.18 |
| 2013/0051152 A1 * | 2/2013 | Lee | G11C 16/3418 365/185.18 |
| 2013/0155772 A1 * | 6/2013 | Leem | G11C 16/12 365/185.11 |
| 2016/0180934 A1 * | 6/2016 | Sakui | G11C 16/3459 365/185.11 |

(Continued)

*Primary Examiner* — Michael T Tran
(74) *Attorney, Agent, or Firm* — Morgan, Lewis & Bockius LLP

(57) ABSTRACT

Power consumption of sensing circuitry in a NAND Flash device is reduced by reducing the voltage supply to a portion of logic circuits in sensing circuitry. A first power domain provides power to a first portion of the logic circuits in the sensing circuity and a second power domain provides power to a second portion of the logic circuits in the sensing circuitry. The first power domain has a higher voltage than the second power domain.

17 Claims, 9 Drawing Sheets

(56) References Cited

U.S. PATENT DOCUMENTS

| | | | | |
|---|---|---|---|---|
| 2016/0180947 | A1* | 6/2016 | Lim | G11C 29/04 |
| | | | | 365/185.11 |
| 2019/0332472 | A1* | 10/2019 | Hong | G06F 11/1068 |
| 2020/0133572 | A1* | 4/2020 | Park | G06F 3/0679 |
| 2020/0321042 | A1* | 10/2020 | Lee | G11C 7/12 |
| 2021/0036015 | A1* | 2/2021 | Lim | G11C 16/08 |
| 2021/0202010 | A1* | 7/2021 | Lee | G11C 16/08 |
| 2021/0397362 | A1* | 12/2021 | Kim | G06F 3/0653 |
| 2022/0415419 | A1* | 12/2022 | Shin | G11C 16/3459 |

* cited by examiner

METHOD AND APPARATUS TO REDUCE POWER CONSUMPTION OF PAGE BUFFER CIRCUITRY IN A NON-VOLATILE MEMORY DEVICE

FIELD

This disclosure relates to non-volatile memory devices and in particular to NAND Flash memory devices.

BACKGROUND

Non-volatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive. The non-volatile memory can comprise a block addressable memory device, such as NAND, or more specifically, multi-threshold level NAND Flash memory (for example, Single-Level Cell ("SLC"), Multi-Level Cell ("MLC"), Quad-Level Cell ("QLC"), Tri-Level Cell ("TLC"), or some other NAND). The NAND Flash cell uses the threshold voltage of a floating-gate transistor to represent the data stored in the cell.

NAND Flash memory devices typically use a one-transistor memory cell that allows for high memory densities, high reliability, and low power consumption. Memory cells are typically arranged in a memory array and are addressable with a row/column format. Data lines used to transfer signals to/from the various memory cells can be coupled to low-voltage circuitry that may be configured to handle relatively low voltages, such as logic or data cache circuitry.

Three Dimensional (3D) NAND is a type of non-volatile flash memory in which memory cells are stacked vertically in multiple layers. For example, 32, 48, 64 or more cell layers can be stacked vertically.

BRIEF DESCRIPTION OF THE DRAWINGS

Features of embodiments of the claimed subject matter will become apparent as the following detailed description proceeds, and upon reference to the drawings, in which like numerals depict like parts, and in which:

Figure 1:
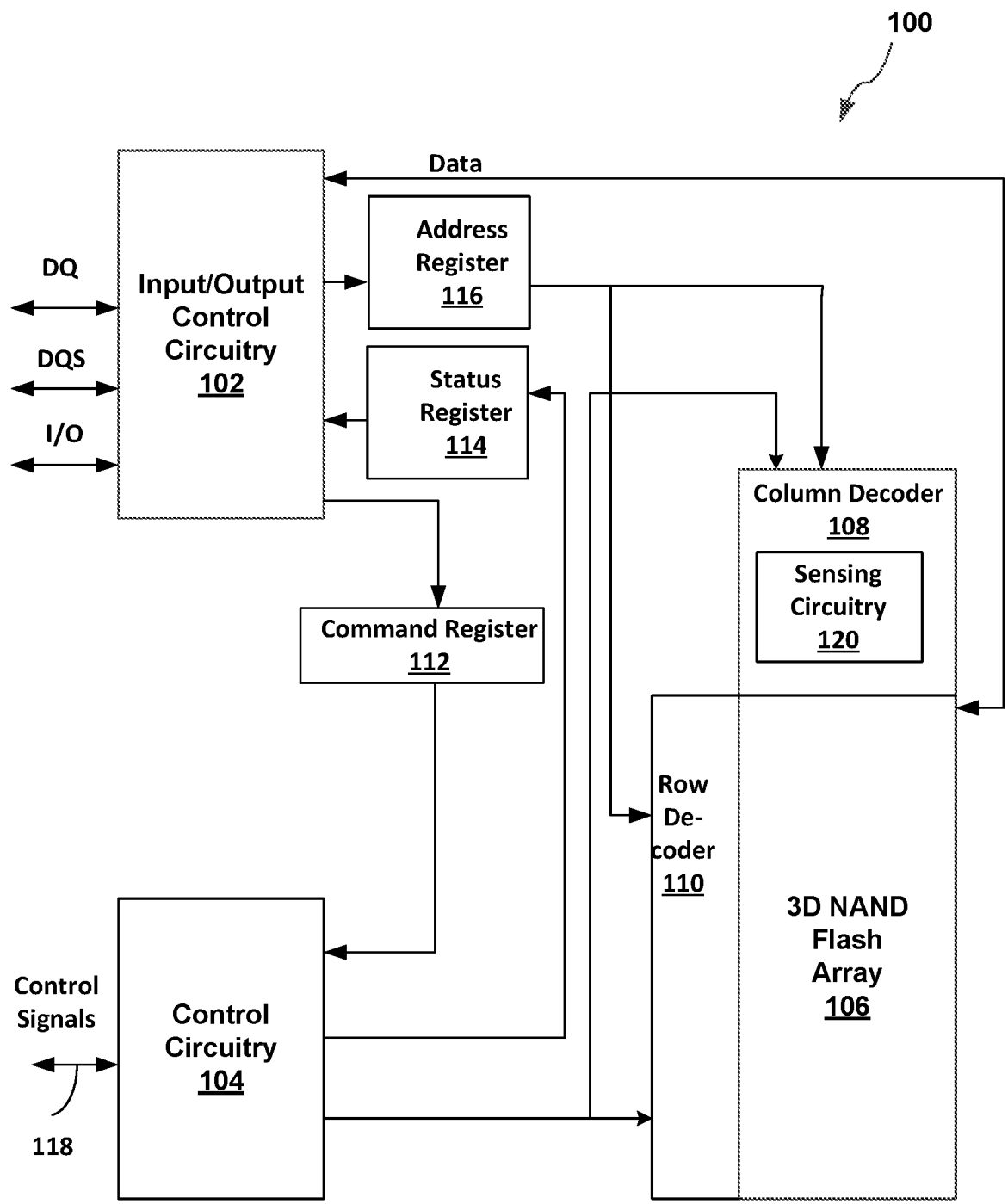
FIG. 1 is a block diagram of a 3D (Three-Dimensional) NAND Flash device.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

A 3D NAND device includes a 3D NAND Flash array that includes a plurality of NAND cells organized in rows and columns. A column is also referred to as a bit line. A row is also referred to as a word line. A NAND cell can include a transistor with a floating gate (for example, a high resistance poly gate) that stores charge indicative of one or more bit values.

A block of planar NAND Flash includes a grid of NAND cells connected by word lines (WLs) and bit lines (BLs). A word-line is a set of all cells corresponding to one row across block bit-lines. A page is a set of bits corresponding to the same bit level in word-line. The number of pages per WL in the block is based on the type of memory cell. A single-level cell ("SLC") stores one bit of information per cell in one page (lower page). A multi-level cell ("MLC") stores two bits of information per cell in two pages (lower page, upper page). Data is stored as a threshold voltage of the NAND cell, based on the logical value (for example, logical 1 or logical 0 for a SLC; logical 00, 01, 10 or 11 for a MLC) that the NAND cell represents.

A string is a series of connected NAND cells in which the source of one NAND cell is connected to the drain of the next NAND cell. Strings are organized into pages which are then organized into blocks in which each string is connected to a separate line called a bit line. All NAND cells with the same position in the string are connected through control gates by a word line. A plane contains a certain number of blocks that are connected through the same bit line.

Data is programmed/read from the NAND flash page-by-page. Only one NAND cell in the string is read at a time per bit line. To read one NAND cell per bit line, the transistors for the NAND cells in the bit line that are not being read are ON to allow the value from the NAND cell being read to propagate to the output.

Memory access operations performed on a block of a NAND cells involve the pre-charging of the bit lines by sensing circuitry. In order to confirm whether a memory cell in the block of NAND cells is in an erase state "1" or program state "0," a pre-charge voltage is applied to increase the voltage of the bit line to a predetermined value, followed by detecting a change in the voltage of the bit line by comparing the voltage of the bit line with the pre-charged voltage used as a reference.

The sensing circuitry includes logic circuits and sensing/bit line driving circuits. Power consumption of circuitry in the NAND device could be reduced by reducing the voltage supply to the sensing circuitry. However, if there is a reduction in the voltage supply to the sensing/bit line driving circuits, the sensing/bit driving circuits are unable to provide voltage levels required for sensing (string voltage) and programming (bit line inhibit voltage).

Power consumption of sensing circuitry in the NAND device is reduced by reducing the voltage supply to a portion of logic circuits in the sensing circuitry. A first power domain provides power to a first portion of the logic circuits in the sensing circuity and a second power domain provides power to a second portion of the logic circuits in the sensing circuitry. The first power domain has a higher voltage than the second power domain.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is a block diagram of a 3D (Three-Dimensional) NAND device 100. The 3D NAND device 100 includes Input/Output Control circuitry 102 and control circuitry 104 that are coupled to a host memory controller (not shown) via a plurality of control and data signals. The 3D NAND device 100 also includes a 3D NAND Flash array 106 that includes a plurality of NAND cells organized in rows and columns.

A row decoder 110 and a column decoder 108 are provided to decode address signals to access the 3D NAND Flash array 106. The 3D NAND device 100 further includes input/output (I/O) control circuitry 102 to manage input of commands, addresses, and data to the 3D NAND device 100 and the output of data and status information from the 3D NAND device 100. An address register 116 is in communication with I/O control circuitry 102, row decoder 110 and column decoder 108, to latch the address signals prior to decoding. A command register 112 is in communication with I/O control circuitry 102 and control circuitry 104 to latch incoming commands. A status register 114 is in communication with I/O control circuitry 102 and control circuitry 104 to latch incoming status.

Control circuitry 104 controls access to the 3D NAND Flash array 106 in response to the commands and generates status information that can be stored in status register 114. Control circuitry 104 is in communication with row decoder 110 and column decoder 108 to control the row decoder 110 and column decoder 108 in response to the addresses. Additionally, control circuitry 104 can issue erase commands that trigger activation of one or more high voltage transistors within row decoder 110 and column decoder 108. The column decoder 108 includes sensing circuitry 120 that detects the state cells in the 3D NAND Flash array 106 by sensing voltage or current on a particular bit line in the 3D NAND Flash array 106.

The Open NAND Flash Interface (ONFI) is a standard that defines the operation of the data bus and the control signals. The ONFI standard supports an 8-bit or 16-bit data bus (two independent 8-bit data buses) and up to four NAND die in a package.

The Input/Output Control circuitry 102 in the 3D NAND device 100 communicates with the host memory controller via a bidirectional data bus (DQ) and a bidirectional data strobe (DQS) signal. The DQS signal is used to indicate a data valid window. The control circuitry 104 in the 3D NAND device 100 receives control signals 118 from the host memory controller. The control signals 118 that are received include chip enable (CE #) to select the 3D NAND device 100 for data transfer with the host memory controller, Address Latch Enable (ALE) to indicate the type of bus cycle (command, address or data), Command Latch Enable (CLE) to indicate the type of bus cycle (command, address or data), Read Enable (RE #), Write Enable (WE #), and Write Protect (WP #) to disable program and erase operations. The 3D NAND device 100 also includes control signals 118 output by control circuitry 104 that include a Ready/Busy (R/B #) signal to indicate whether the 3D NAND device 100 is executing an operation ("busy") or is ready for a next operation.

It will be appreciated that the memory device of FIG. 1 may include additional circuitry and signals, and that the functional blocks of the memory device may not necessarily be segregated as shown in this example case. For example, a single component or component portion of an integrated circuit device could be adapted to perform the functionality of more than one block component of FIG. 1. Alternatively, or in addition, functionality of a single block component of FIG. 1 may be distributed into multiple blocks. Additionally, while specific I/O pins are described in accordance with popular conventions for receipt and output of the various signals, it is noted that other combinations or numbers of I/O pins may be used in the various embodiments. Many variations will be appreciated.

Figure 2:
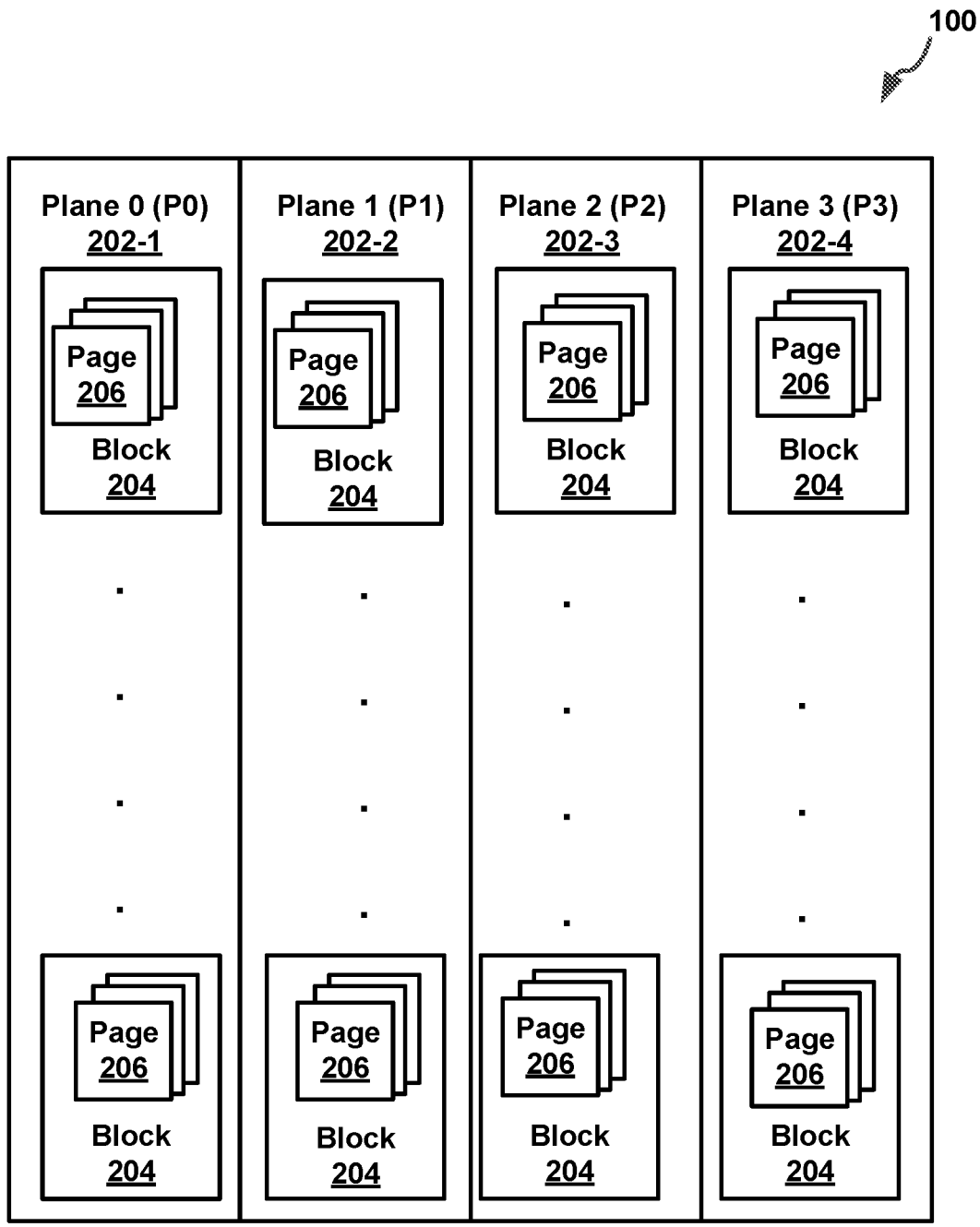
FIG. 2 is a block diagram of an array organization in the 3D (Three-Dimensional) NAND Flash device shown in FIG. 1.

FIG. 2 is a block diagram of an array organization for the 3D (Three-Dimensional) NAND Flash device 100 shown in FIG. 1. In the example shown in FIG. 2, there are four physical planes, plane 0 (P0) 202-1, plane 1 (P1) 202-2, plane 2 (P2) 202-3, and plane 3 (P3) 202-4. Each physical plane 202-1, 202-2, 202-3, 202-4 has respective cache register (not shown) and data register (not shown) independent of the other planes allowing multi-plane operations to perform concurrent Read, Program or Erase operations on multiple planes. Each physical plane 202-1, 202-2, 202-3, 202-4 includes a plurality of blocks 204. Each block 204 is subdivided into a plurality of pages 206.

A block of planar NAND Flash includes a grid of cells connected by word lines (WLs) and bit lines (BLs). A word-line is a set of all cells corresponding to one row across block bit-lines. A page is a set of bits corresponding to the same bit level in word-line. Data is programmed/read from the NAND flash page-by-page. The number of pages per WL in the block is based on the type of memory cell. A single-level cell ("SLC") stores one bit of information per cell in one page (lower page). A multi-level cell ("MLC") stores two bits of information per cell in two pages (lower page, upper page). A Tri-Level Cell ("TLC") stores three bits of information per cell in three pages (lower page, upper page, extra page). A Quad-Level Cell ("QLC") stores four bits of information per cell in four pages (lower page, upper page, extra page, top page). A Penta-Level Cell ("PLC") stores five bits of information per cell in five pages (Lower Page (LP), Upper Page (UP), Extra Page (XP), Top Page (TP), Europa Page (EP)).

Figure 3:
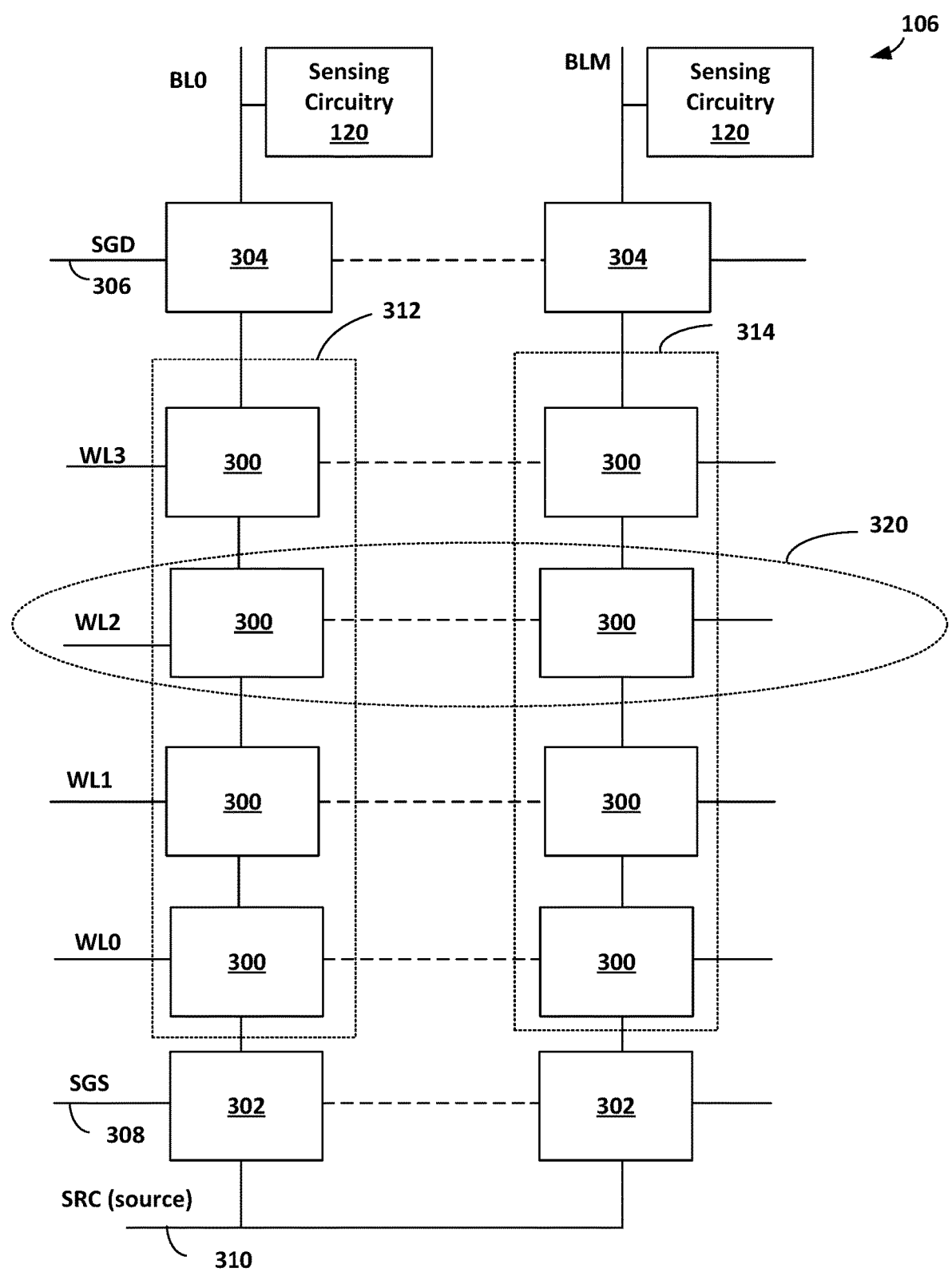
FIG. 3 is a block diagram illustrating a plurality of NAND cells in the 3D NAND Flash array shown in FIG. 1.

FIG. 3 is a block diagram illustrating a plurality of NAND cells 300 in the 3D NAND Flash array 106 shown in FIG. 1. Each of the plurality of NAND cells 300 (non-volatile memory cells) in the 3D NAND Flash array 106 is connected to a word line (WL) and a bit line (BL). A NAND cell 300 can be selected via the BL and the WL. Four word lines labeled W0-W3 and two bit lines labeled BL0, BLM are shown in FIG. 3.

In one example, the NAND memory cell 300 includes a transistor with a replacement gate. A cell with a replacement gate typically has a low resistance gate (for example, a tungsten gate) and a charge trap layer between the gate and the channel where charge is trapped or stored to represent one or more bit values. In another example, a NAND memory cell 300 can include a transistor with a floating gate (for example, a high resistance poly gate) that stores charge indicative of one or more bit values. Other architectures are also possible.

In a 3D NAND Flash array 106 that includes QLC NAND cells, each NAND cell 300 can store four bits, one bit per page (upper, lower, extra, top). In a 3D NAND Flash array 106 that includes TLC NAND cells, each NAND cell 300 can store three bits, one bit per page (upper, lower, top). In a 3D NAND Flash array 106 that includes Penta-Level Cells (PLC) NAND cells, each NAND cell 300 can store five bits.

The plurality of NAND cells 300 are arranged in a two-dimensional (2D) array of strings and tiers. Two 2D array of string of NAND cells 312, 314 and four tiers WL0-WL3 are shown in FIG. 3. Each string of NAND cells 312, 314 is coupled to a source line (SRC) 310 using a respective source select gate 302 and to a respective bit line BL0, BLM using a respective drain select gate 304. The source select gates 302 are controlled by a source select gate control line (SGS) 308. The drain select gates 304 are controlled by a drain select gate control line (SGD) 306. The bit lines BL0, BLM are each coupled to a 2D array of string of NAND cells 312, 314 by a drain select gate 304 and sensing circuitry 120 that detects the state of each cell by sensing voltage or current on a particular bit line BL0, BLM.

In the example shown there are 4 tiers, other examples can include strings of NAND cells having more or fewer tiers or bit lines.

The 3D NAND device 100 is divided into blocks with each block divided into pages. Each page comprises a plurality of NAND cells 300 that share a word line. As shown in FIG. 3, all of the NAND cells 300 in page 320 are coupled to WL2. A block includes the NAND strings that share the same group of word lines. The block is the smallest erasable unit of NAND cells in the 3D NAND device. In a block erase operation, a group of consecutive pages is erased in a particular operation. Erase operates on an entire block of NAND cells 300 and sets all the NAND cells in the block to a logical "1".

To program (write) data to a page 320, a program voltage (Vpgm) is applied to the selected word line (WL2) and thus, to a control gate of each NAND cell 300 coupled to the selected word line. While the program voltage (Vpgm) is applied to the selected word line, a potential, such as a ground potential, can be applied to the bit lines of the NAND cells 300 in the page 320, resulting in a charge transfer to a floating gate of each NAND cell 300 in the page 320. A pass voltage (Vpass) can be applied to one or more word lines (for example, WL3, WL1, WL0) in the block having NAND cells 300 that are not being programmed or a 2 Volts to about 3 Volts inhibit voltage can be applied to bit lines having NAND cells 300 that are not being programed to inhibit charge from being transferred to the floating gates of the NAND cells 300 that are not selected for programming.

To erase a block of NAND cells 300, a 18 Volts to about 20 Volts erasure voltage is applied between the sources and drains of the NAND cells 300 in the block using one or more bit lines and select gates while the word lines of the targeted NAND cells 300 are kept at a ground potential resulting in a charge transfer from the floating gates of the NAND cells in the block. An erase operation is the process of removing electrons from the floating gates to change the state of cell to logical "1". A large erasure voltage, for example, 20 Volts is required to repel the electrons from the floating gate.

Figure 4A:
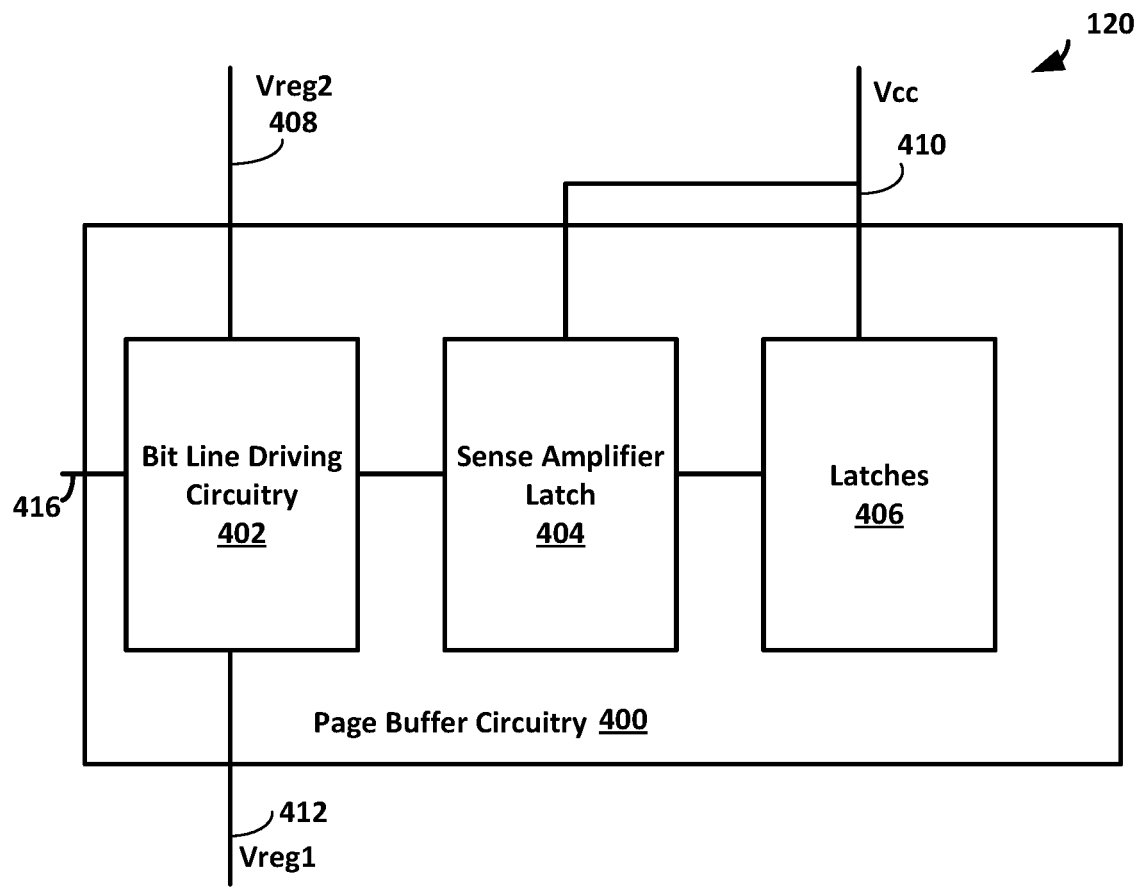
FIG. 4A is a block diagram illustrating page buffer circuitry in the sensing circuit in the 3D NAND Flash device shown in FIG. 1.

FIG. 4A is a block diagram illustrating page buffer circuitry 400 in the sensing circuitry 120 in the NAND device 100 shown in FIG. 1. The page buffer circuitry 400 includes latches 406, a sense amplifier latch 404 and bit line driving circuitry 402. Power consumption of the page buffer circuitry 400 in the sensing circuitry 120 in the NAND device is reduced by reducing the voltage supply to a portion of logic circuits in the sensing circuitry 120. A first power domain provides power to the bit line driving circuitry 402 and a second power domain provides power to the latches 406 and the sense amplifier latch 404. The first power domain has a higher voltage than the second domain. In an embodiment, the voltage supplied to the first power domain is 2.3V (Vreg2) and the voltage supplied to the second power domain is 1.2-1.9V (Vcc).

The latches 406 in the page buffer circuitry 400 can temporarily store data during operations relating to reading data from or writing data to the 3D NAND Flash array 106 of memory device 100. For example, during a write operation, the latches 406 in page buffer circuitry 400 can store data while additional data is accumulated to match a data unit size utilized by the memory device 100. Similarly, during a read operation, the latches 406 in page buffer circuitry 400 can store data read from memory device 100 while portions of the data are provided to a host memory controller.

The bit line driving circuitry 402 in the page buffer circuitry 400 performs pre-charging operations associated with memory access operations on the bit lines of the 3D NAND Flash array 106 of memory device 100.

Figure 4B:
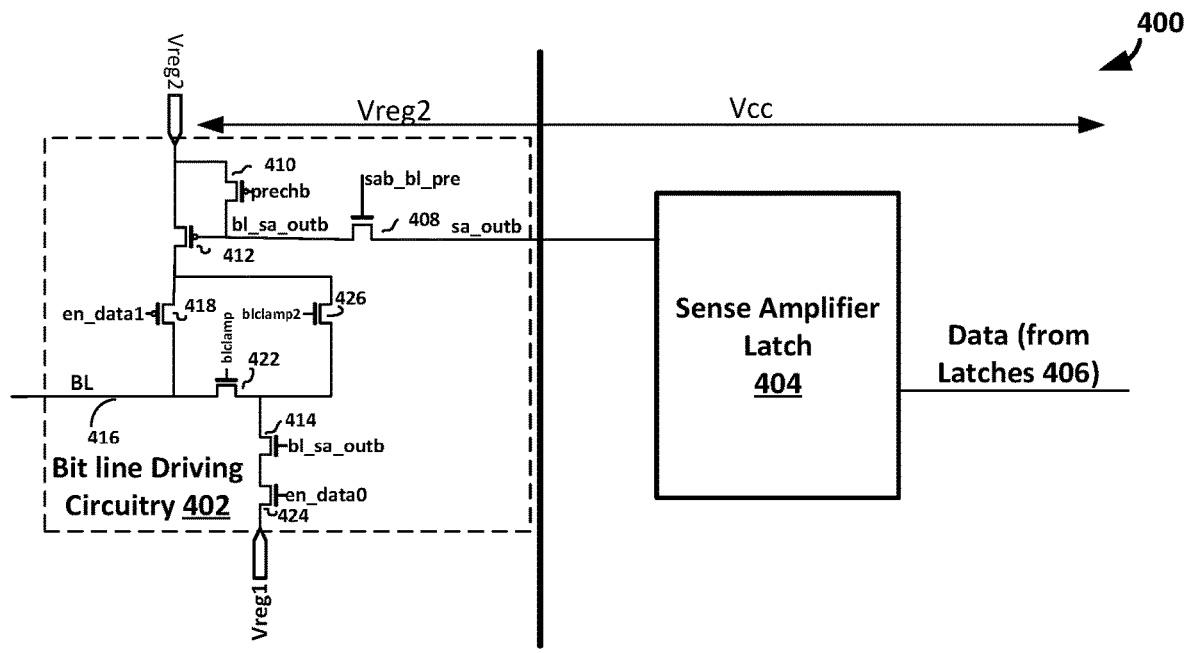
FIG. 4B is a circuit diagram of an embodiment of the bit line driving circuitry in the page buffer circuitry shown in FIG. 4A.

FIG. 4B is a circuit diagram of an embodiment of the bit line driving circuitry 402 in the page buffer circuitry 400 shown in FIG. 4A. Sense Amplifier latch 404 receives data from latches 406 in the page buffer circuitry 400. An sa_outb signal is output from the sense amplifier latch 404. NMOS transistors 408, 414, 422, 424 and PMOS transistors 410, 412, 418 in the bit line driving circuitry 402 are metal oxide semiconductor field effect transistor (MOSFET) devices.

The inhibit path during the program of a NAND string 312, 314 includes inhibit path PMOS transistor 412 and PMOS transistor 418. The program path during the program of a NAND string 312 and a NAND string 314 includes NMOS transistor 414, NMOS transistor 424 and NMOS transistor 422. The NAND string voltage Vds during sensing of a NAND string 312, 314 is determined by inhibit path PMOS transistor 412, NMOS transistor 426 and NMOS transistor 422.

During the program of a NAND string 312, 314, Vreg1 is 0V (or close to 0V) (the BL bias voltage to program the NAND string 312, 314), while Vreg2 is about 2.3V (the BL bias voltage to inhibit the programming of a NAND string 312, 314). The voltage (Vreg2 or Vreg1) that is passed to the NAND string 312, 314 is determined by the voltage on the sa_outb signal that is output from the sense amplifier latch 404.

During the sensing of a NAND string 312, 314, Vreg2 can be about 2.3V or 1.9V while Vreg1 is typically about 0.5V or 0V. The sa_outb signal and the bl_sa_outb signal are logic 1 for NAND strings that have already been sensed, the BL 416 is connected to Vreg1 which is the same voltage on the NAND String SRC 310. Thus, for a NAND string that has already been sensed, current does not flow through the NAND string and sensing is inhibited.

Isolation NMOS transistor 408 in the bit line driving circuitry 402 isolates the sense amplifier latch 404 from the bit line driving circuitry 402. The sa_outb signal (output signal from the sense amplifier latch 404) is coupled to the source of isolation NMOS transistor 408. The sab_bl_pre (sense amplifier_bit line_pre charge) signal is driven by a driver (not shown) external to the page buffer circuitry 400 and is coupled to the gate of isolation NMOS transistor 408.

The sab_bl_pre signal can activate the isolation NMOS transistor 408 (turn ON isolation NMOS transistor 408 to allow signal flow from the source to the drain of isolation NMOS transistor 408) or deactivate the isolation NMOS transistor 408 (turn OFF isolation NMOS transistor 408 to prevent signal flow from the source to the drain of isolation NMOS transistor 408).

The drain of isolation NMOS transistor 408 is coupled to the bit line sense amplifier output (bl_sa_outb) signal and to the drain of pre-charge PMOS transistor 410. The source of pre-charge PMOS transistor 410 is coupled to Vreg2. The drain of the pre-charge PMOS transistor 410 is coupled to a prechb signal.

During pre-charge of the bl_sa_outb signal to Vreg2, pre-charge PMOS transistor 410 is ON and isolation NMOS transistor 408 is OFF (sab_bl_pre signal is 0V at the gate of isolation NMOS transistor 408). Pre-charge PMOS transistor 410 pre-charges bl_sa_outb nodes (bit line nodes) to the Vreg2 voltage. In an embodiment the Vreg2 voltage is 2.3 Volts (V).

After the bl_sa_outb signal has been pre-charged to Vreg2, the voltage level on the gate of pre-charge PMOS transistor 410 is Vreg (2.3V), the voltage level on the source of pre-charge PMOS transistor 410 is Vreg (2.3V) and the voltage level on the drain of pre-charge PMOS transistor 410 is 2.3V. Pre-charge PMOS transistor 410 is OFF and isolation NMOS transistor 408 is ON (sab_bl_pre signal is Vcc at the gate of isolation NMOS transistor 408).

When isolation NMOS transistor 408 is ON, the output (sa_outb) signal from the sense amplifier latch 404 passes from the source of isolation NMOS transistor 408 to the drain of isolation NMOS transistor 408 which is coupled to the drain of pre-charge PMOS transistor 410 and the gate of inhibit path PMOS transistor 412.

The voltage level of the bl_sa_outb signal is dependent on the voltage level of the sa_outb signal from the sense amplifier latch 404. If the voltage level of the sa_outb signal is Vcc ((1.2-1.9V), the voltage level of the bl_sa_outb remains at Vreg2 (2.3V). If the voltage level of the sa_outb signal is 0V, the Vreg2 (2.3V) voltage on bl_sa_outb is discharged to 0V because the voltage level on the gate of isolation NMOS transistor 408 is Vcc (1.2-1.9V) and the voltage level on the source of isolation NMOS transistor 408 is 0V.

The isolation NMOS transistor 408 acts as a cascode device and protects the Sense Amplifier latch 404 in the case of a super low voltage (MOS device) devices usage. If Vreg2 is 2.3V, the maximum voltage on the sa_outb signal is in the range of acceptable voltages in the page buffer circuitry 400 to avoid device damage even if the voltage supplied to the page buffer circuitry 400 is 1.2V. Therefore SLV (Super Low Voltage) devices which cannot survive higher voltages are enabled for use. SLV devices typically operate in a range of 1-1.8V and will be damaged if exposed to higher voltages (for example, 2.3V).

While isolation NMOS transistor 408 is OFF, the capacitance associated with pre-charge PMOS transistor 410, inhibit path PMOS transistor 412, NMOS transistor 414 and bl_sa_outb signal routing lines can maintain a charge from the sa_outb signal received from sense amplifier latch 404 through isolation NMOS transistor 408 for a period of time. During the period of time, one or both of inhibit path PMOS transistor 412 and NMOS transistor 414 are activated allowing a voltage from one of voltage supplies Vreg2 and Vreg1 to flow onto one or more bit lines (BL) 416 as a pre-charge signal during a pre-charging operation. The pre-charging operation is based at least in part on the calculation result stored by the capacitance of pre-charge PMOS transistor 410, NMOS transistor 414 and bl_sa_outb signal routing lines.

In an embodiment, voltage supply Vreg2 in bit line driving circuitry 402 is limited to about 10 milli Amps (mA) per plane. Voltage supply Vreg2 does not require a dedicated Low Drop Out (LDO) regulator. Voltage supply Vreg2 can be locally generated (close to each page buffer circuitry 400). The Vreg2 voltage supply has a limited current path that requires small and limited amounts of current to supply the bit line driving circuitry 402. The metal budget in the NAND device 100 is reduced because the Vreg2 voltage supply supplies much less and much more controllable current while the rest of page buffer circuitry 400 can be supplied by the Vcc voltage supply that is used by other circuitry in the NAND device 100.

Figure 5:
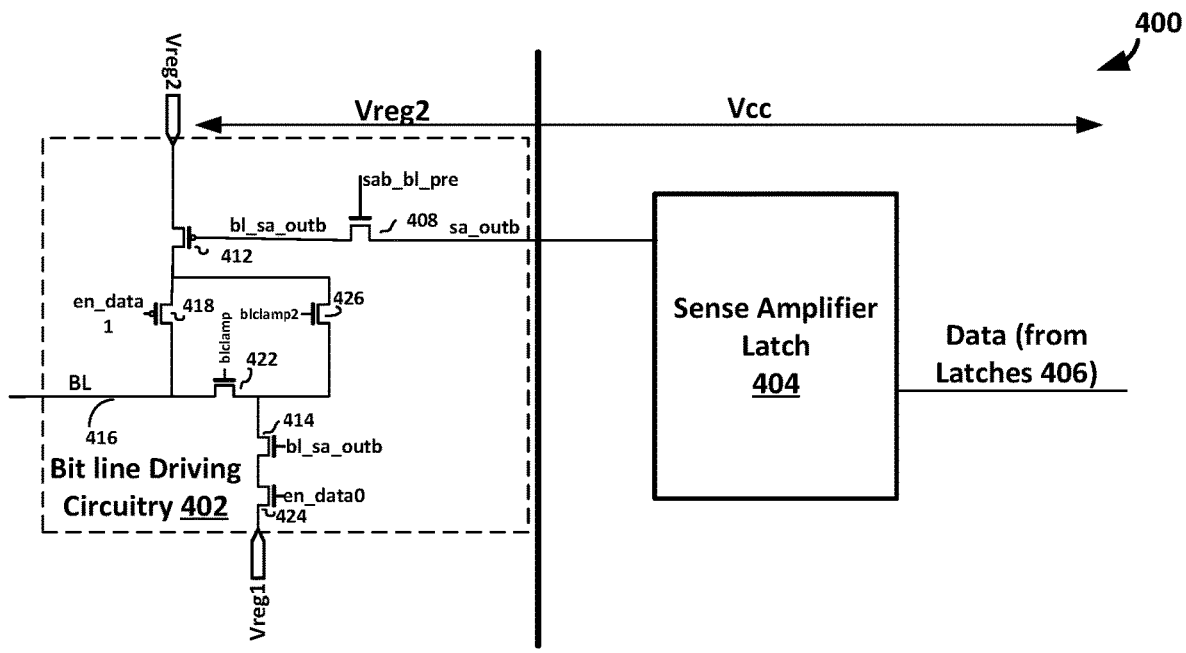
FIG. 5 is a circuit diagram of another embodiment of the bit line driving circuitry in the page buffer circuitry 400 shown in FIG. 4A.

FIG. 5 is a circuit diagram of another embodiment of the bit line driving circuitry 402 in the page buffer circuitry 400 shown in FIG. 4A.

The threshold voltage (Vth) of a PMOS transistor is the gate voltage at which significant current starts to flow from the source to the drain. A leakage current may flow from the source to the drain when the gate voltage is below the threshold voltage.

The embodiment shown in FIG. 5 does not include the pre-charge PMOS transistor 410 shown in the embodiment shown in FIG. 4A to pre-charge bl_sa_outb nodes to the Vreg2 voltage. Instead of using the pre-charge PMOS transistor 410 to pre-charge the bl_sa_outb nodes to Vreg2, the threshold voltage of inhibit path PMOS transistor 412 is changed via an implant process during manufacture of the NAND device 100. The threshold voltage of PMOS transistor is selected via the implant process so that inhibit path PMOS transistor 412 turns OFF with acceptable leakage current and turns ON with acceptable drive current (Idrive) via PMOS transistor 418 to BL 416. In an embodiment, the Vreg2 voltage is 2.3 Volts (V), the Vcc voltage is 1.9V and the voltage on the bl_sa_outb signal is 1.6V (Vcc voltage— IR drop (reduction in voltage due to resistance in the voltage supply grid)). The minimum threshold voltage (Vth) to turn OFF inhibit path PMOS transistor 412 is 0.7V, with a leakage current that is based on the number of page buffers divided by 2 when the source-gate voltage (Vsg) minus the threshold voltage (Vsg−Vth) of inhibit path PMOS transistor 412 is 0V. When the voltage at the gate of inhibit path PMOS transistor 412 is 1.6V, the voltage at the source of inhibit path PMOS transistor 412 is 2.3V (Vreg2) and the threshold voltage (Vth) for inhibit path PMOS transistor 412 is greater than 0.7V, the Vsg−Vth voltage is <0V and inhibit path PMOS transistor 412 is OFF. For example, a leakage current of 10 nano Amps (nA) per page buffer for 75K buffers is less than 1 milli Amps (mA) per plane which is an acceptable leakage current. For example, an acceptable drive current of 100 nA per transistor (x single PB) results typically in less than 10 mA x plane The maximum threshold voltage (Vth) to turn the inhibit path PMOS transistor 412 ON is 2V. The inhibit path PMOS transistor 412 is turned ON when the bl_sa_outb signal at the gate of inhibit path PMOS transistor 412 is 0V. The overdrive of the inhibit path PMOS transistor 412 is the difference between the source-gate voltage (Vsg) of inhibit path PMOS transistor 412 and the maximum threshold voltage. Vsg is (Vreg2—bl_sa_outb), with Vreg2=2.3V and bl_sa_outb=0, Vsg is 2.3V. With Vsg=2.3V and Vth=2V, the overdrive of the inhibit path PMOS transistor 412 is 300 milli Volts (mV) which is sufficient to provide the current (~100 nA) required by the BL 416 when the inhibit path PMOS transistor 412 is ON.

In another embodiment, the Vreg2 voltage is 2.3 Volts (V), the Vcc voltage is 1.2V and the voltage on the bl_sa_outb signal is 1.0V (Vcc voltage—IR drop (reduction in voltage due to resistance in the voltage supply grid)). The minimum threshold voltage to turn inhibit path PMOS transistor 412 OFF is 1.3V, with a leakage current that is based on the number of page buffers divided by 2 when the source-gate voltage (Vsg) of inhibit path PMOS transistor 412 is 0V.

While inhibit path PMOS transistor 412 is OFF, the voltage on the bl_sa_outb signal is 1.0V at the gate of inhibit path PMOS transistor 412. The source-gate voltage (Vsg) is 1.3V and the threshold voltage (Vth) is >1.3V. When the gate voltage of inhibit path PMOS transistor 412 is at minimum voltage (1V) and the threshold voltage (Vth) of inhibit path PMOS transistor 412 is at the minimum voltage (1.3V), Vsg–Vth is 0V which is typically sufficient to limit leakage current to 10 nano Amps (nA) per page buffer which is less than 1 milli Amps (mA) for a plane.

The maximum threshold voltage (Vth) to turn ON inhibit path PMOS transistor 412 is 2V, with a drain-source current (Ids) that is based on the difference between the source-gate voltage (Vsg) of inhibit path PMOS transistor 412 and the maximum threshold voltage. For example, if the voltage at the gate of inhibit path PMOS transistor 412 is 0V and the difference between the source-gate voltage (Vsg) of inhibit path PMOS transistor 412 and the maximum threshold voltage (Vth) is greater than 300 mV, the inhibit path PMOS transistor 412 can supply a drain-source current (Ids) greater or equal to 100 nano Amps (nA).

Figure 6A:
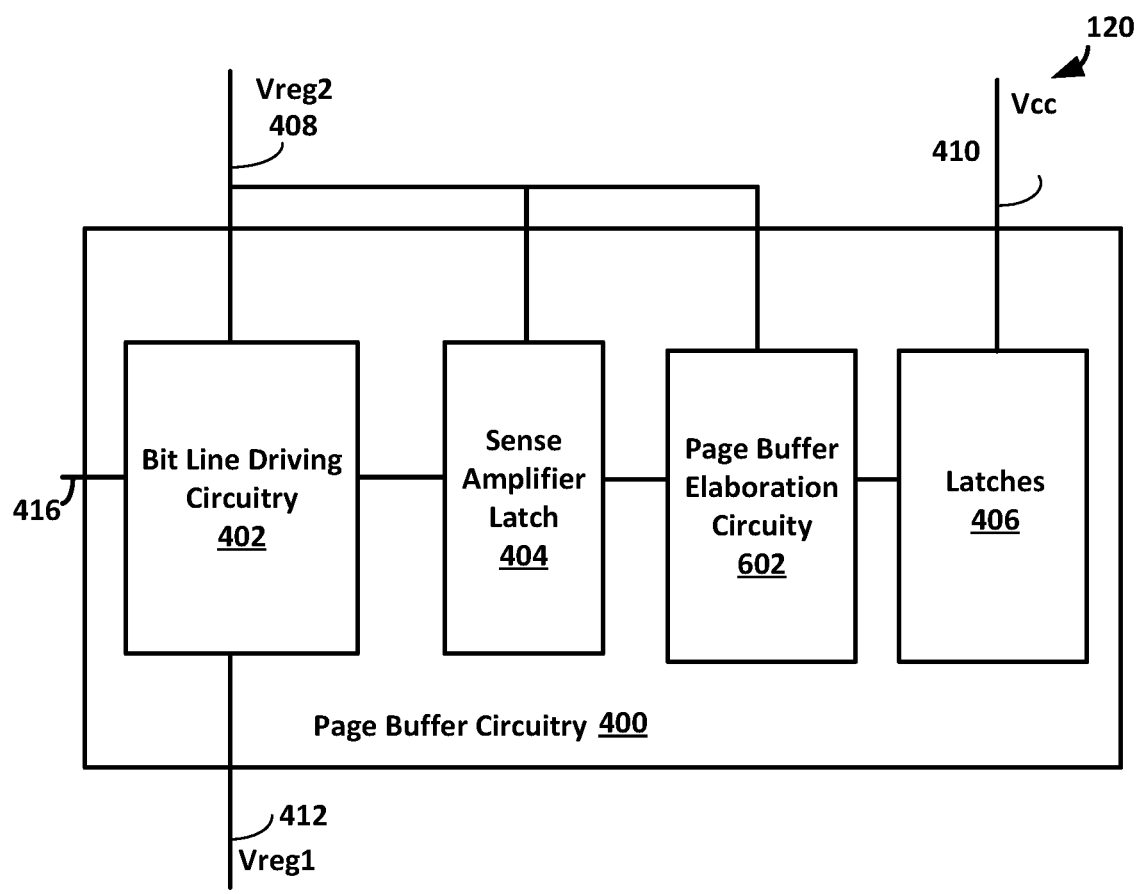
FIG. 6A is a block diagram illustrating another embodiment of page buffer circuitry in the sensing circuit in the 3D NAND Flash device shown in FIG. 1.

FIG. 6A is a block diagram illustrating another embodiment of page buffer circuitry 400 in the sensing circuitry 120 in the 3D NAND Flash device 100 shown in FIG. 1.

The page buffer circuitry 400 includes latches 406, a sense amplifier latch 404, page buffer elaboration circuitry 602 and bit line driving circuitry 402. Power consumption of the page buffer circuitry 400 in the sensing circuitry 120 in the NAND device is reduced by reducing the voltage supply to a portion of logic circuits in the page buffer circuitry 400. A first power domain provides power to the bit line driving circuitry 402, sense amplifier latch 404 and page buffer elaboration circuitry 602 and a second power domain provides power to the latches 406. The first power domain has a higher voltage than the second domain. In an embodiment, the voltage supplied to the first power domain is 2.3V (Vreg2) and the voltage supplied to the second power domain is 1.2 Vcc).

Figure 6B:
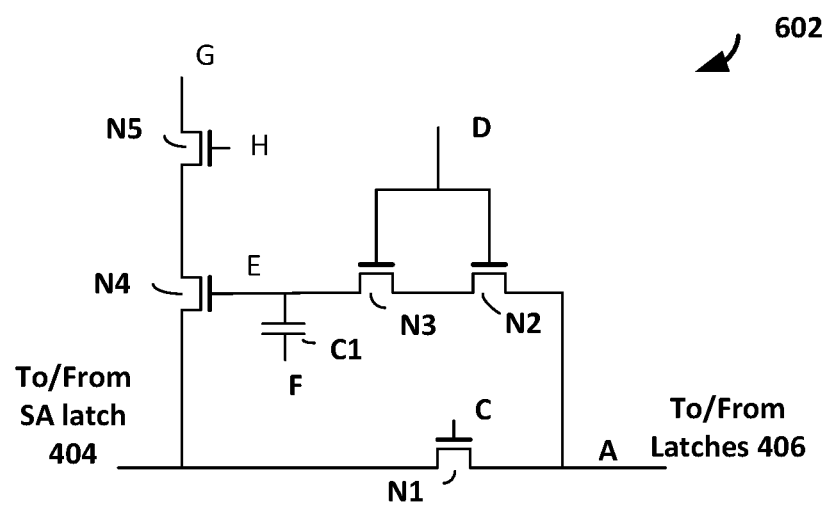
FIG. 6B is a circuit diagram of an embodiment of the Page Buffer Elaboration Circuitry in the page buffer circuitry shown in FIG. 6A.

FIG. 6B is a circuit diagram of an embodiment of the page buffer elaboration circuitry 602 in the page buffer circuitry 400 shown in FIG. 6A.

The page buffer elaboration circuitry 602 includes low voltage NMOS transistors N1, N2, N3, N4, N5 and capacitor C1. Latch data is transferred between Node A and latches 406. Sense Amp latch data is transferred between node B and sense amplifier latch 404. The power level of the latches 406 is 1.2V, the power level of the SA latch is 2.3V and the power level of Node A can be 1.2V or 0V.

Data (voltage level 1.2V (logical 1) or voltage level is 0V (logical 0) can be copied from Node A to Node B. Prior to copying data from Node A to Node B, the voltage at Node G is 0V, the voltage at Node H is 3.6V, the voltage at Node F, Node D, Node C and node B is 0 v. The voltage at Node E is 0V. To copy the data from Node A to Node B, the voltage at Node C is increased to 2V, the voltage at Node D is increased to 1.2V and the voltage at Node G is increased to 2.3V. The Node B voltage is the Node C voltage minus the N1 threshold voltage.

When the Node A voltage is 1.2V (logical 1), the Node B voltage is 1.2V, when the Node A voltage is 0V (logical 0), the node B voltage is 0V. The Node E voltage is 0.5V (Node D voltage (1.2V)—threshold voltage of N3 (0.7V) when the Node A voltage is 1.2V. The Node E voltage is 0V and the Node D voltage is 1.2V when the Node A voltage is 0V. The Node F voltage is increased from 0V to 3.6V which increases the Node E voltage to 3.3V (0.5V+(3.6V×0.78)), where 0.78 is the boosted voltage ratio of C1. This increases the node B voltage to 2.3V.

When the Node A voltage is 0V and the Node D voltage is 1.2V and, the Node F voltage drops from 3.6V to 0V by discharging the Node E voltage through N2 and N3. The Node B voltage is 0V.

Data (voltage level 1.2V (logical 1) or voltage level is 0V (logical 0) can be copied from Node B to Node A. The initial voltage on Node A is 0 v, Node G is 2.3V, node C is 0V and node D is 0V. The voltage on node C is increased to 2.1V when the node B voltage is 2.3V. The node A voltage is 0V when the node C voltage is 2.1V and the node B voltage is 0V.

Figure 7:
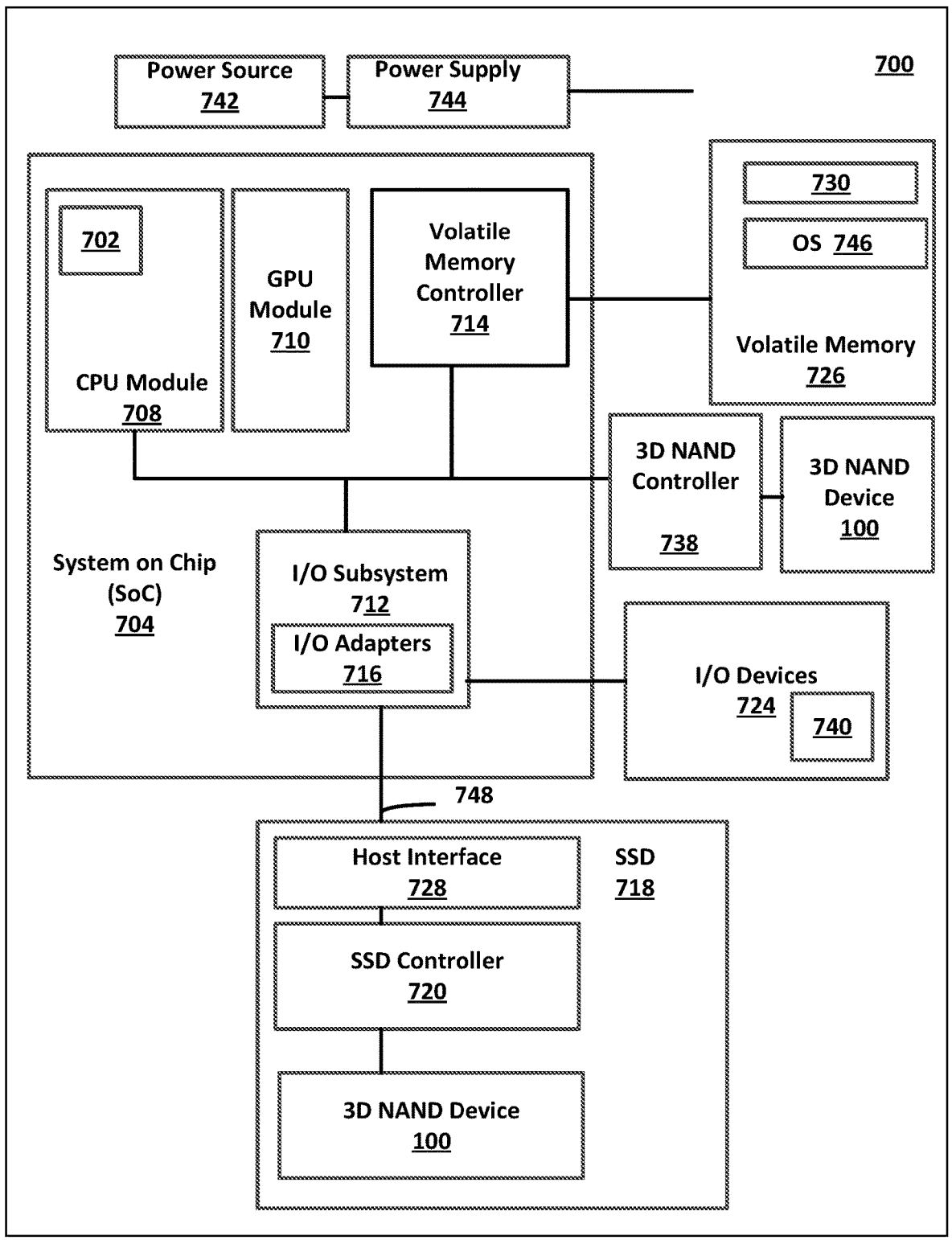
FIG. 7 is a block diagram of a computer system 700 that includes the 3D NAND device.

FIG. 7 is a block diagram of a computer system 700 that includes 3D NAND device 100. Computer system 700 can correspond to a computing device including, but not limited to, a server, a workstation computer, a desktop computer, a laptop computer, and/or a tablet computer.

The computer system 700 includes a system on chip (SOC or SoC) 704 which combines processor, graphics, memory, and Input/Output (I/O) control logic into one SoC package. The SoC 704 includes at least one Central Processing Unit (CPU) module 708, a volatile memory controller 714, and a Graphics Processor Unit (GPU) 710. In other embodiments, the volatile memory controller 714 can be external to the SoC 704. Although not shown, each of the processor core(s) 702 can internally include one or more instruction/data caches, execution units, prefetch buffers, instruction queues, branch address calculation units, instruction decoders, floating point units, retirement units, etc. The CPU module 708 can correspond to a single core or a multi-core general purpose processor, such as those provided by Intel® Corporation, according to one embodiment.

The Graphics Processor Unit (GPU) 710 can include one or more GPU cores and a GPU cache which can store graphics related data for the GPU core. The GPU core can internally include one or more execution units and one or more instruction and data caches. Additionally, the Graphics Processor Unit (GPU) 710 can contain other graphics logic units that are not shown in FIG. 7, such as one or more vertex processing units, rasterization units, media processing units, and codecs.

Within the I/O subsystem 712, one or more I/O adapter(s) 716 are present to translate a host communication protocol utilized within the processor core(s) 702 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 716 can communicate with external I/O devices 724 which can include, for example, user interface device(s) including a display and/or a touch-screen display 740, printer, keypad, keyboard, communication logic, wired and/or wireless, storage device(s) including hard disk drives ("HDD"), solid-state drives ("SSD") 718, removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (Non-Volatile Memory Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 716 can also communicate with a storage device, that can be a hard disk drive (HDD) or a solid-state drive ("SSD") 718 which includes a SSD controller 720, a host interface 728 and a 3D NAND device 100.

The computer system 700 can include a 3D NAND device 100 and a 3D NAND memory controller 738 communicatively coupled to the CPU module 708 in the SoC 704. The 3D NAND device 100 can be included in a dual in-line memory module (DIMM) that can be referred to as a non-volatile dual in-line memory module (NVDIMM).

A non-volatile memory (NVM) device is a memory whose state is determinate even if power is interrupted to the device. In one embodiment, the NVM device can comprise a block addressable memory device, such as NAND technologies, or more specifically, multi-threshold level NAND Flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place memory (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The I/O adapters 716 can include a Peripheral Component Interconnect Express (PCIe) adapter that is communicatively coupled using the NVMe (NVM Express) over PCIe (Peripheral Component Interconnect Express) protocol over bus 748 to a host interface 728 in the solid state drive 718. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Applications 730 and an operating system (OS) 746 can be stored in volatile memory 726. Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

An operating system 746 is software that manages computer hardware and software including memory allocation and access to I/O devices. Examples of operating systems include Microsoft® Windows®, Linux®, iOS® and Android®.

Power source 742 provides power to the components of system 700. More specifically, power source 742 typically interfaces to one or multiple power supplies 744 in system 700 to provide power to the components of system 700. In one example, power supply 744 includes an AC to DC (alternating current to direct current) adapter to plug into a wall outlet. Such AC power can be renewable energy (e.g., solar power) power source 742. In one example, power source 742 includes a DC power source, such as an external AC to DC converter. In one example, power source 742 or power supply 744 includes wireless charging hardware to charge via proximity to a charging field. In one example, power source 742 can include an internal battery or fuel cell source.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A non-volatile memory device comprising:
a memory array, the memory array including a plurality of non-volatile memory cells connected by word lines and bit lines; and
page buffer circuitry coupled to the bit lines in the memory array, a first portion of the page buffer circuitry to receive power from a first power domain and a second portion of the page buffer circuitry to receive power from a second power domain, a first voltage for the first power domain greater than a second voltage for the second power domain,
wherein the non-volatile memory cells are Three Dimensional (3D) NAND cells.

2. The non-volatile memory device of claim 1, wherein the page buffer circuitry includes bit line driving circuitry, a sense amplifier latch and latches, the bit line driving circuitry to receive power from the first power domain and the sense amplifier latch and latches to receive power from the second power domain.

3. The non-volatile memory device of claim 2, wherein the bit line driving circuitry includes a pre-charge PMOS transistor to pre-charge a bit line node to the first voltage.

4. The non-volatile memory device of claim 2, wherein the bit line driving circuitry includes an inhibit path PMOS transistor, a threshold voltage of the inhibit path PMOS transistor selected via an implant process.

5. The non-volatile memory device of claim 1, wherein the page buffer circuitry includes bit line driving circuitry, a sense amplifier latch, page buffer elaboration circuitry and latches, the latches to receive power from the first power domain and the bit line driving circuitry, the sense amplifier latch and the page buffer elaboration circuitry to receive power from the second power domain.

6. The non-volatile memory device of claim 1, wherein the first voltage is 2.3V and the second voltage is 1.6V or 1V.

7. A system comprising:
a memory controller; and
a non-volatile memory device coupled with the memory controller, the non-volatile memory device comprising:
a memory array, the memory array including a plurality of non-volatile memory cells connected by word lines and bit lines; and
page buffer circuitry coupled to the bit lines in the memory array, a first portion of the page buffer circuitry to receive power from a first power domain and a second portion of the page buffer circuitry to receive power from a second power domain, a first voltage for the first power domain greater than a second voltage for the second power domain, wherein the page buffer circuitry includes bit line driving circuitry, a sense amplifier latch and latches, the bit line driving circuitry to receive power from the first power domain and the sense amplifier latch and latches to receive power from the second power domain.

8. The system of claim 7, wherein the bit line driving circuitry includes a pre-charge PMOS transistor to pre-charge a bit line node to the first voltage.

9. The system of claim 7, wherein the bit line driving circuitry includes an inhibit path PMOS transistor, a threshold voltage of the inhibit path PMOS transistor selected via an implant process.

10. The system of claim 7, wherein the page buffer circuitry includes bit line driving circuitry, a sense amplifier latch, page buffer elaboration circuitry and latches, the latches to receive power from the first power domain and the bit line driving circuitry, the sense amplifier latch and the page buffer elaboration circuitry to receive power from the second power domain.

11. The system of claim 7, wherein the non-volatile memory cells are Three Dimensional (3D) NAND cells.

12. The system of claim 7, further comprising:
one or more of:
a processor,
a power supply, and
a display coupled with the non-volatile memory device.

13. A method comprising:
receiving, by a first portion of page buffer circuitry, power from a first power domain, the page buffer circuitry coupled to a memory array, the memory array including a plurality of non-volatile memory cells connected by word lines and bit lines; and receiving, by a second portion of the page buffer circuitry, power from a second power domain, a first voltage for the first power domain greater than a second voltage for the second power domain, wherein the non-volatile memory cells are Three Dimensional (3D) NAND cells.

14. The method of claim 13, wherein the page buffer circuitry includes bit line driving circuitry, a sense amplifier latch and latches, the bit line driving circuitry to receive power from the first power domain and the sense amplifier latch and latches to receive power from the second power domain.

15. The method of claim 14, wherein the bit line driving circuitry includes a pre-charge PMOS transistor to pre-charge a bit line node to the first voltage.

16. The method of claim 14, wherein the bit line driving circuitry includes an inhibit path PMOS transistor, a threshold voltage of the inhibit path PMOS transistor selected via an implant process.

17. The method of claim 13, wherein the page buffer circuitry includes bit line driving circuitry, a sense amplifier latch, page buffer elaboration circuitry and latches, the latches to receive power from the first power domain and the bit line driving circuitry, the sense amplifier latch and the page buffer elaboration circuitry to receive power from the second power domain.

* * * * *